(12) United States Patent
Alvi et al.

(10) Patent No.: US 12,176,892 B2
(45) Date of Patent: Dec. 24, 2024

(54) ELECTRONIC CONTROL OF SWITCHING SLEW RATES

(71) Applicant: GM GLOBAL TECHNOLOGY OPERATIONS LLC, Detroit, MI (US)

(72) Inventors: Muhammad Hussain Alvi, Troy, MI (US); Khorshed Mohammed Alam, Canton, MI (US); Yilun Luo, Ann Arbor, MI (US); Chandra S. Namuduri, Troy, MI (US); Suresh Gopalakrishnan, Troy, MI (US); Junghoon Kim, Ann Arbor, MI (US); Mohamed Kamel, Rochester, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 160 days.

(21) Appl. No.: 17/957,116

(22) Filed: Sep. 30, 2022

(65) Prior Publication Data

US 2024/0113711 A1    Apr. 4, 2024

(51) Int. Cl.
*H02P 21/22* (2016.01)
*H02P 23/28* (2016.01)
*H02P 27/06* (2006.01)
*H03K 17/04* (2006.01)
*H03K 17/16* (2006.01)
*H03K 17/687* (2006.01)

(52) U.S. Cl.
CPC ........ *H03K 17/6877* (2013.01); *H02P 23/28* (2016.02); *H02P 27/06* (2013.01); *H03K 17/0406* (2013.01); *H03K 17/168* (2013.01)

(58) Field of Classification Search
CPC .......... H03K 17/6877; H03K 17/0406; H03K 17/168; H03K 17/163; H02P 23/28; H02P 27/06
See application file for complete search history.

(56) References Cited

U.S. PATENT DOCUMENTS

| | | | | |
|---|---|---|---|---|
| 2018/0138902 A1* | 5/2018 | Lu | .......... | H03K 17/14 |
| 2019/0149145 A1* | 5/2019 | Yang | .......... | H02M 3/155 |
| | | | | 318/139 |
| 2021/0159772 A1* | 5/2021 | Lee | .......... | H02M 7/53871 |
| 2022/0263404 A1* | 8/2022 | Volke | .......... | H02M 7/5387 |

* cited by examiner

*Primary Examiner* — Muhammad S Islam
(74) *Attorney, Agent, or Firm* — CANTOR COLBURN LLP

(57) ABSTRACT

A system includes an electronic device including a circuit having a semiconductor switch, and a switching control system operably connected to the semiconductor switch. The switching control system is configured to control a switching speed of the semiconductor switch based on a received voltage by altering at least one of a gate resistance and a gate capacitance of the semiconductor switch.

20 Claims, 9 Drawing Sheets

ELECTRONIC CONTROL OF SWITCHING SLEW RATES

INTRODUCTION

The subject disclosure relates to switching devices, and more particularly to controlling switching speeds of switching devices.

High speed switching devices are used in a variety of applications. For example, electric and hybrid electric vehicles feature conversion devices such as DC-DC converters and inverters. Such devices are used to control power supply from battery storage to electric motors, electronics and other vehicle subsystems. Switching speeds (i.e., slew rates) are an important factor to consider when designing and operating conversion devices. For example, if switching speeds are too low, efficiency can be compromised. Conversely, switching speeds that are too fast can cause voltage overshoots and other negative effects. Accordingly, it is desirable to provide systems and techniques for balancing switching speeds to achieve high efficiency with reduced negative effects.

SUMMARY

In one exemplary embodiment, a system includes an electronic device including a circuit having a semiconductor switch, and a switching control system operably connected to the semiconductor switch. The switching control system is configured to control a switching speed of the semiconductor switch based on a received voltage by altering at least one of a gate resistance and a gate capacitance of the semiconductor switch.

In addition to one or more of the features described herein, the switching control system includes a variable resistor connected to a gate of the semiconductor switch and a gate driver, and a controller configured to control the variable resistor to alter the gate resistance.

In addition to one or more of the features described herein, the variable resistor is a magnetoresistive gate resistor, the controller configured to control the magnetoresistive gate resistor by controlling current through at least one of the circuit and the switching control system to change a magnetic field around the magnetoresistive gate resistor.

In addition to one or more of the features described herein, the current is alternating current, and the magnetoresistive gate resistor is disposed proximate to a conductor that conducts the alternating current.

In addition to one or more of the features described herein, the switching control system includes a variable capacitor connected to a gate of the semiconductor switch and a gate driver, and a controller configured to control the variable capacitor to alter the gate resistance.

In addition to one or more of the features described herein, the switching control system includes a capacitance multiplier circuit including a power amplifier, and the switching control system is configured to control the variable capacitor by applying a modulated signal to control an internal capacitance of the capacitance multiplier circuit.

In addition to one or more of the features described herein, the electronic device is an inverter configured to control AC power to an electric motor of a vehicle.

In addition to one or more of the features described herein, the switching speed is controlled based on at least one of a motor torque and a DC bus voltage.

In another exemplary embodiment, a method includes receiving electrical power by an electronic device including a circuit having a semiconductor switch, and controlling a switching speed of the semiconductor switch based on a received voltage by a switching control system operably connected to the semiconductor switch. Controlling the switching speed includes altering at least one of a gate resistance and a gate capacitance of the semiconductor switch.

In addition to one or more of the features described herein, the switching speed is controlled during a switching event.

In addition to one or more of the features described herein, the switching control system includes a variable resistor connected to a gate of the semiconductor switch and a gate driver, and altering the gate resistance includes controlling the variable resistor.

In addition to one or more of the features described herein, the variable resistor is a magnetoresistive gate resistor, and altering the gate resistance includes controlling current through at least one of the circuit and the switching control system to change a magnetic field around the magnetoresistive gate resistor.

In addition to one or more of the features described herein, the switching control system includes a variable capacitor connected to a gate of the semiconductor switch and a gate driver, and altering the gate resistance includes controlling the variable capacitor.

In addition to one or more of the features described herein, the switching control system includes a capacitance multiplier circuit including a power amplifier, and altering the gate resistance includes applying a modulated signal to control an internal capacitance of the capacitance multiplier circuit.

In yet another exemplary embodiment, a system of a vehicle includes an inverter configured to control alternating current (AC) power to an electric motor of the vehicle, the inverter including a circuit having a semiconductor switch, and a switching control system operably connected to the semiconductor switch. The switching control system is configured to control a switching speed of the semiconductor switch based on a received voltage by altering at least one of a gate resistance and a gate capacitance of the semiconductor switch.

In addition to one or more of the features described herein, the switching control system includes a variable resistor connected to a gate of the semiconductor switch and a gate driver, and a controller configured to control the variable resistor to alter the gate resistance.

In addition to one or more of the features described herein, the variable resistor is a magnetoresistive gate resistor, and the controller is configured to control the magnetoresistive gate resistor by controlling current through the circuit to change a magnetic field around the magnetoresistive gate resistor.

In addition to one or more of the features described herein, the switching control system includes a variable capacitor connected to a gate of the semiconductor switch and a gate driver, and a controller configured to control the variable capacitor to alter the gate resistance.

In addition to one or more of the features described herein, the switching speed in controlled based on a motor torque and vehicle speed to maximize the switching speed and minimize voltage overshoot.

In addition to one or more of the features described herein, the vehicle system further includes a transmitter configured to wirelessly transmit information including at least one of gate resistance and gate capacitance to a remote entity.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
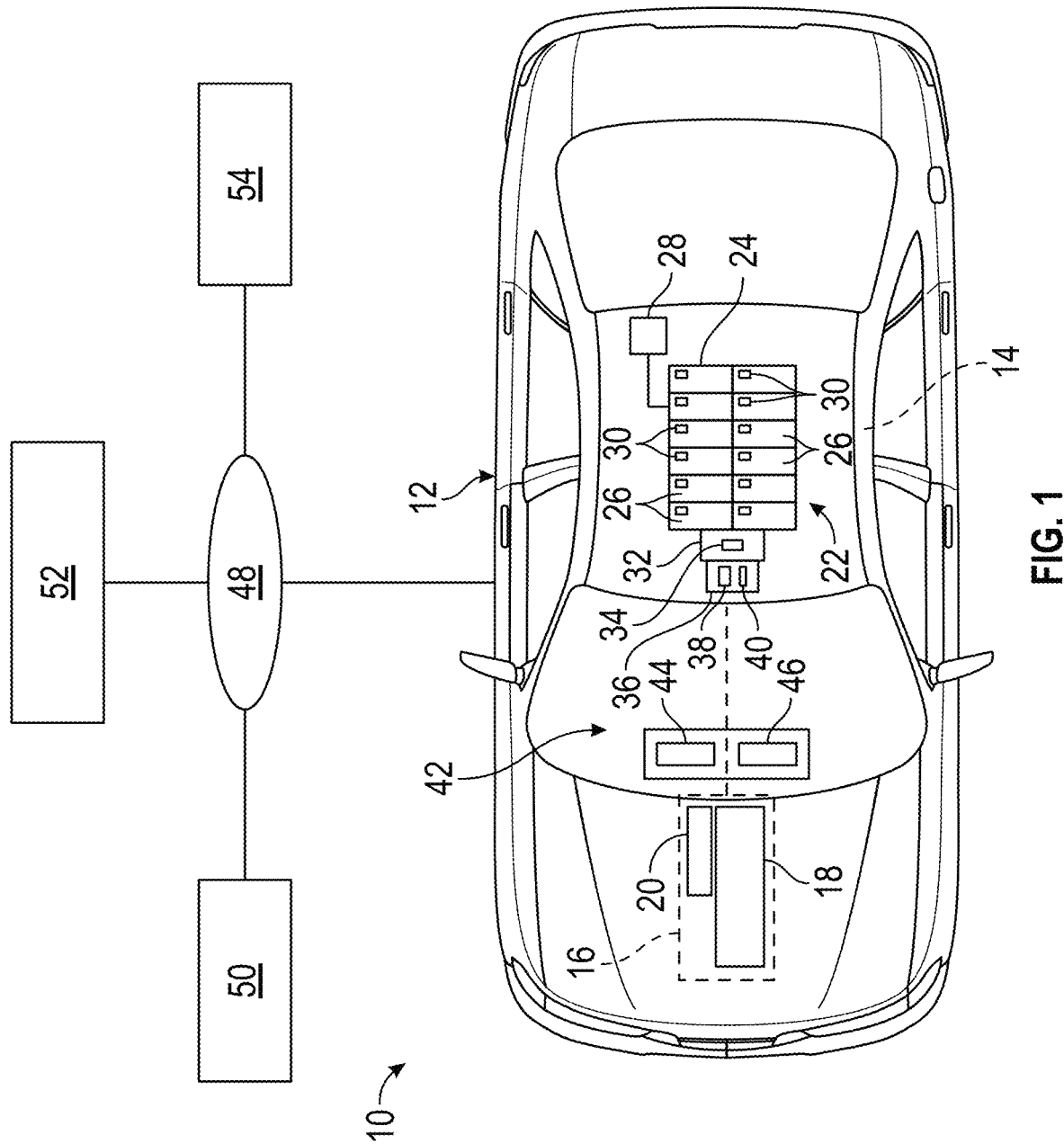
FIG. 1 is a top schematic view of a motor vehicle including a battery assembly and a switching control system, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for controlling operation of a conversion device or other electronic device that includes one or more semiconductor switches (e.g., MOSFETs or power MOSFETs). An embodiment of a switching control system includes a switch control device operably connected to a circuit having one or more semiconductor switches, such as a DC-DC converter, inverter or other conversion device. In an embodiment, the conversion device is included in a vehicle for controlling electric motor operation.

In an embodiment, the switch control device is operably connected to a gate of a semiconductor switching device (i.e., switch) and is configured to control switching speed or slew rate by altering a gate resistance of the semiconductor switch. The switching control system may include a variable resistor connected to the gate, the resistance of which is controlled to alter the gate resistance and switching speed. In an embodiment, the variable resistor is a magnetoresistive gate resistor. Additionally, or alternatively, the switching control system includes a variable capacitor connected to the gate, and the switch control device controls the switching speed by controlling switch capacitance (e.g., gate-source capacitance).

Embodiments described herein present numerous advantages and technical effects. For example, the embodiments provide for precise control of switching speeds, so that switching speeds can be optimized to provide maximum performance and efficiency while avoiding negative effects, such as voltage overshoot. In addition, the embodiments provide for precise control without the need to make significant hardware changes.

For example, in vehicle inverters, it is typically desired to switch as fast as possible. With wide bandgap (WGB) semiconductors used in inverters, semiconductor switching events can reach voltage transients dV/dt (where dV is a change in voltage and dt is change in time) greater than 10k V/µs (voltage per microsecond) and current transients dI/dt (where dI is a change in current) greater than 10k A/µs (amps per microsecond).

However, transients that are too high can cause damage to inverters and electric motors, for example, by causing voltage overshoot on inverter switches and/or motor terminal voltage overshoot. Although gate voltage control can control slew rates, such control is generally not feasible due to complexity of implementation, and thus gate resistance is generally kept constant. Embodiments address these problems and provide a solution that can effectively control switching speeds under various conditions (e.g., city driving vs. highway driving) to maximize efficiency while avoiding overshoots, without complex hardware changes.

The embodiments are not limited to use with any specific vehicle or device or system that utilizes battery assemblies, and may be applicable to various contexts. For example, the embodiments may be used with automobiles, trucks, aircraft, construction equipment, farm equipment, automated factory equipment and/or any other device or system that may use electronic devices having semiconductor switches.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle may be a combustion engine vehicle, an electrically powered vehicle (EV) or a hybrid electric vehicle (HEV). In an example, the vehicle 10 is a hybrid vehicle that includes a combustion engine 18 and an electric motor 20.

The vehicle 10 includes a battery system 22, which may be electrically connected to the motor 20 and/or other components, such as vehicle electronics. In an embodiment, the battery system 22 includes a battery assembly such as a high voltage battery pack 24 having a plurality of battery modules 26. Each of the battery modules 26 includes a number of individual cells (not shown). The battery system 22 may also include a monitoring unit 28 configured to receive measurements from sensors 30. Each sensor 30 may be an assembly or system having one or more sensors for measuring various battery and environmental parameters, such as temperature, current and voltages. The monitoring unit 28 includes components such as a processor, memory, an interface, a bus and/or other suitable components.

The battery system 22 includes various conversion devices for controlling the supply of power from the battery pack 24 to the motor 20 and/or electronic components. The conversion devices include a DC-DC converter module 32 that is electrically connected to the battery system 22 and includes a DC-DC converter circuit (converter) 34.

The conversion devices also include an inverter module 36 that includes an inverter 38 and a switching control system 40. The inverter 38 receives DC power from the DC-DC converter 34 and converts direct current (DC) power to alternating current (AC) power that is supplied to the electric motor 20. The inverter 38 including one or more sets of switches or switching devices (e.g., controllable semiconductor switches such as metal-oxide-semiconductor field-effect transistors (MOSFETs)) that are controllable to supply AC power to each phase of the motor 20.

The switching control system 40 includes one or more devices that are configured to control a switching speed or "slew rate" of the sets of switches to maximize drive efficiency while minimizing negative effects such as voltage spikes or overshoots. The switching control system 40 may be part of the same component as shown in FIG. 1, or may be incorporated into a separate component.

The vehicle 10 also includes a computer system 42 that includes one or more processing devices 44 and a user interface 46. The various processing devices and units may communicate with one another via a communication device or system, such as a controller area network (CAN) or transmission control protocol (TCP) bus. In addition, the monitoring unit 28, the inverter module 36, the switching control system 40, the computer system 42 and/or other processing components in the vehicle 10 (e.g., a vehicle control unit) may be configured to communicate with various remote devices and systems such as remote servers and other vehicles. Such communication can be realized, for example, via a network 48 (e.g., cellular network, etc.) and/or via wireless communication. For example, the vehicle 10 may communicate with one or more other vehicles 50, a remote entity 52 (e.g., a workstation, a computer, a server, a service provider, fleet management or monitoring system, etc.), and/or a database or other storage location 54.

Figure 2:
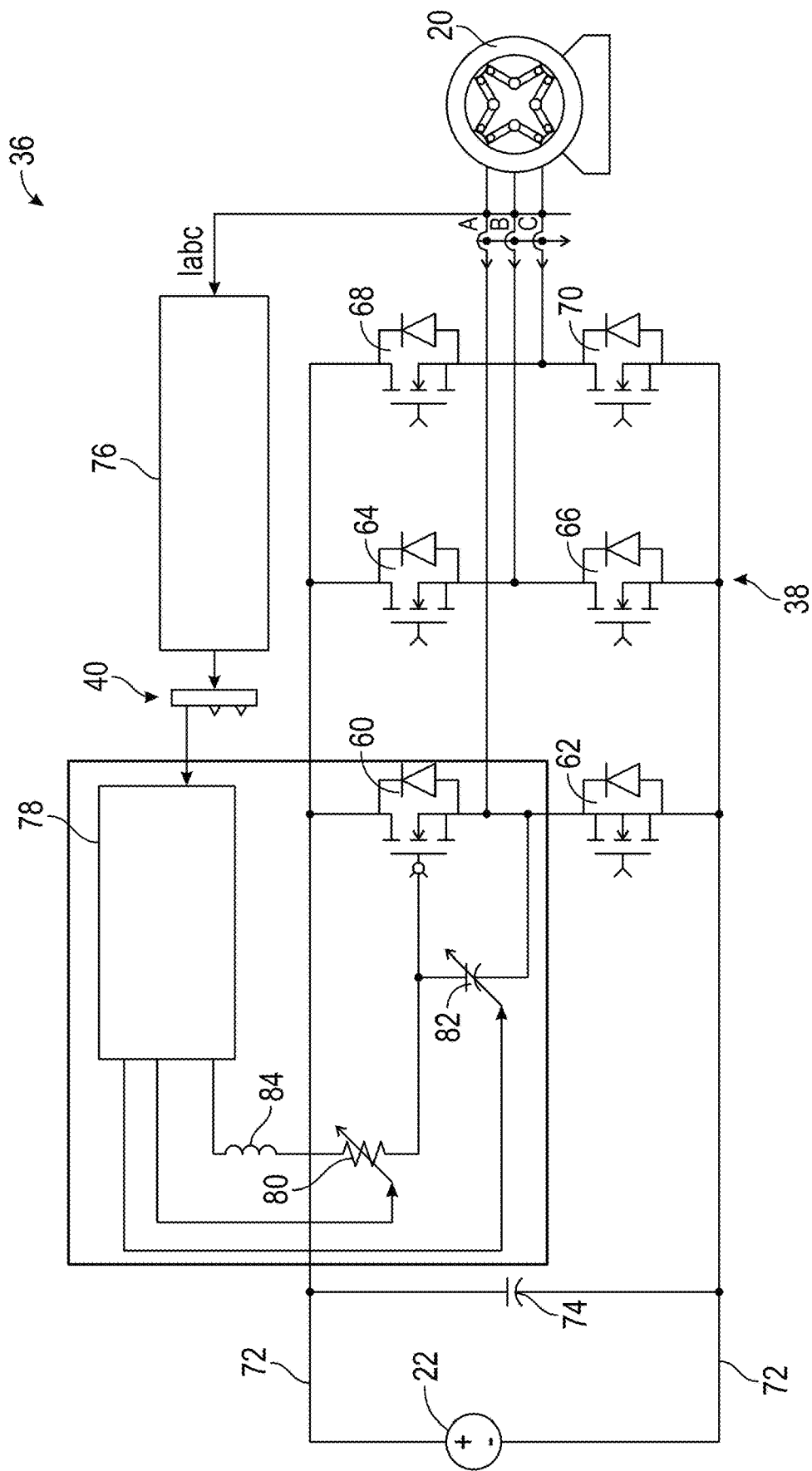
FIG. 2 depicts a conversion device and a switching control system, in accordance with an exemplary embodiment.

FIG. 2 depicts an embodiment of the inverter module 36 including the inverter (inverter circuit) 38 and the switching control system 40. The inverter 38 includes a switching assembly including at least one inverter switch connected to each phase of a three-phase electric motor, such as the motor 20. A first switching assembly includes an inverter switch 60 and an inverter switch 62 connected to a first phase (phase A), a second switching assembly includes an inverter switch 64 and an inverter switch 66 connected to a second phase (phase B), and a third switching assembly includes an inverter switch 68 and an inverter switch 70 connected to a third phase (phase C).

In an embodiment, each inverter switch is a semiconductor switch. As non-limiting examples, inverter switches may include metal-oxide-semiconductor (MOS)-controlled Thyristors (MCTs), gallium-nitride (GaN) field-effect transistors (FETs), metal-oxide-semiconductor field-effect transistors (MOSFETs), silicon carbide junction field-effect transistors (SiC JFETs), insulated-gate bipolar transistors (IGBTs) or any other suitable low loss device of suitable voltage and current ratings.

The switching assemblies are connected to the battery system 22 by a DC propulsion bus 72. Additional components may be included, such as a bulk capacitor 74 (Xcap) for stabilizing voltage.

The switching control system 40 includes a controller 76 connected to a gate driver 78. The controller 76 receives phase current measurements from each phase (Iabc) and outputs control signals to drive the switch 60. The controller 76 also provides control signals for varying the resistivity and/or capacitance of the switch gate, and thereby controlling switching speed. Although the controller 76 is only shown as connected to the switch 60, it is to be understood that the controller 76 may be connected to drivers of each other inverter switch in the inverter 38.

The switching control system 40 includes one or more devices for varying the resistivity and/or capacitance of a switch gate. In an embodiment, the one or more devices include a variable resistor 80 connected in series with a gate 88 of the switch 60. In an embodiment, the one or more devices include an electronically variable capacitor (EVC) 82 connected to parallel with the gate to control gate-source capacitance (Cgs). The variable capacitor 82 may be a voltage variable capacitor, a piezoelectric capacitor (e.g., MEMS piezoelectric capacitor) or any other suitable device.

The switching control system 40 may include both the variable resistor 80 and the variable capacitor 82 as shown. Alternatively, the switching control system 40 includes the variable resistor 80 or the variable capacitor 82.

Figure 3A:
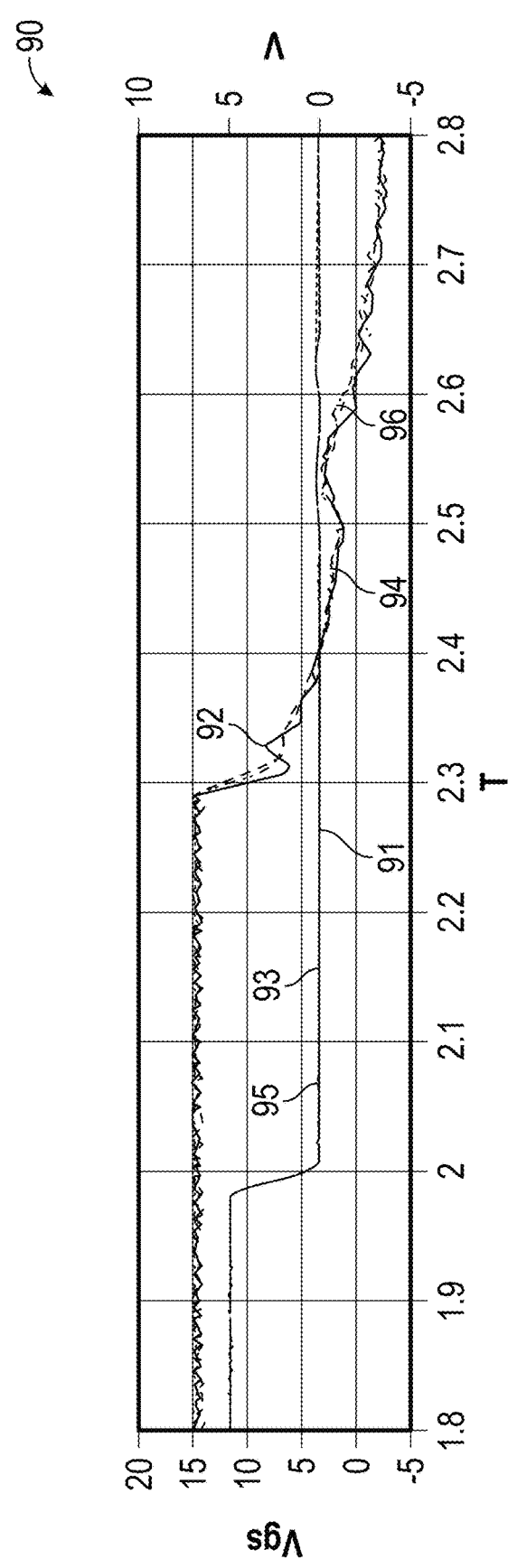
FIGS. 3A-3C depict examples of voltage and current parameters of a switching device having a switching speed controlled using variable capacitance.
Figure 3B:
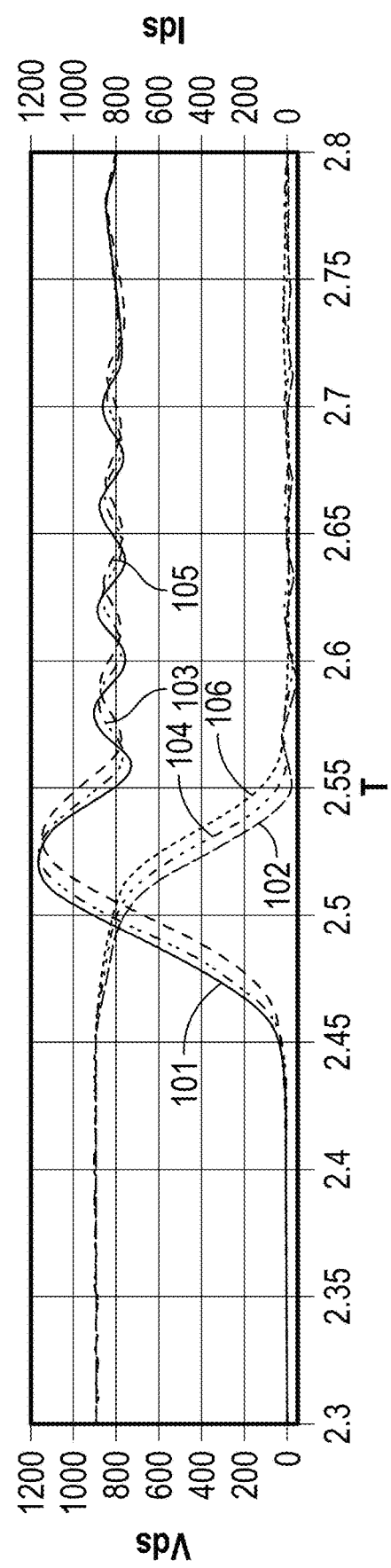
Figure 3C:
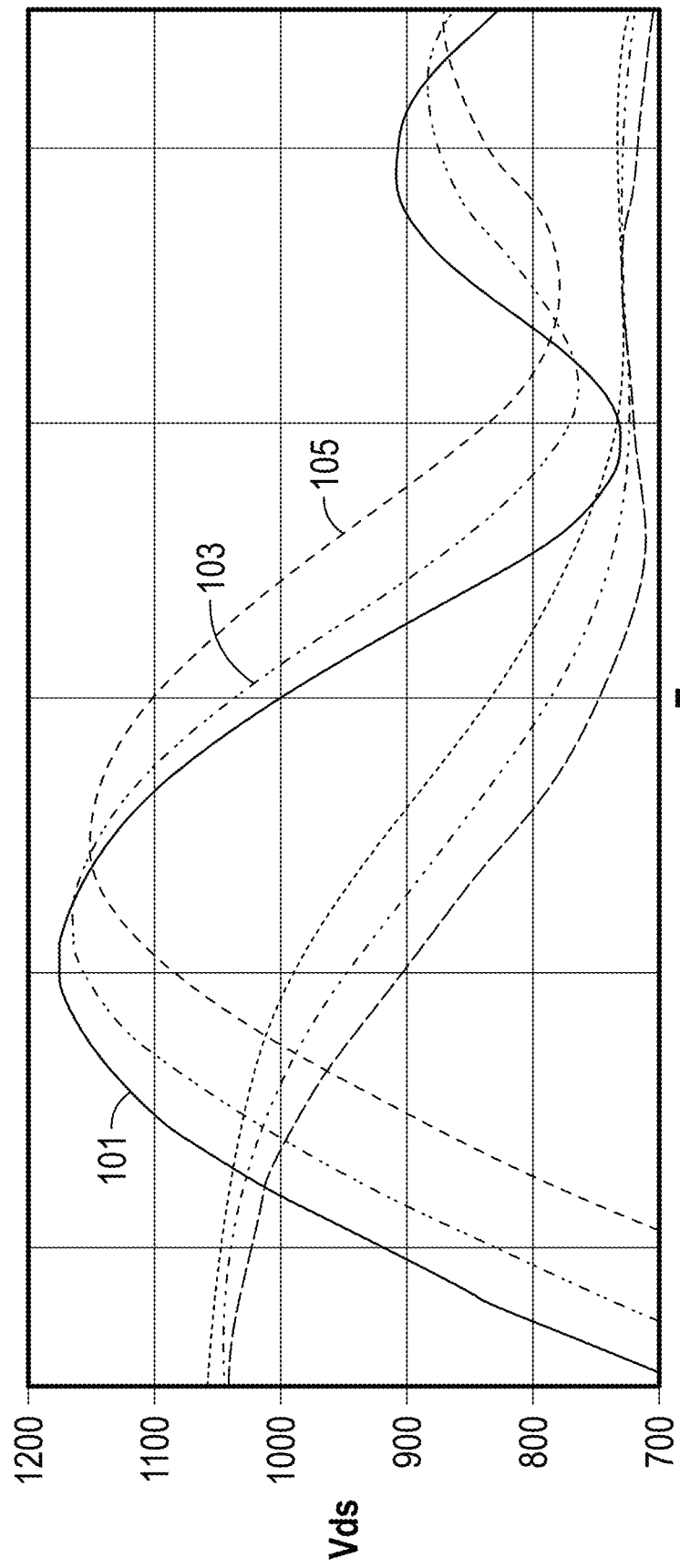

FIG. 3A-3C show various examples of the effect of variable capacitance on slew rate and voltage overshoot. FIG. 3A includes a graph 90 that shows gate-source voltage Vgs (in volts or V) and control voltage Vc (provided by the gate driver 78) as a function of time T (in microseconds or μs) during a switching event. FIG. 3B shows a graph 100 of drain-source voltage Vds voltage (in V) and current I (in amps or A) of the switch 60 during the switching event.

Graph 90 includes a curve 91 representing the Vc, and a curve 92 representing the Vgs, for a capacitance of 5 nano-Farads (nF). A curve 93 represents the Vc, and a curve 94 represents the Vgs, for a capacitance of 10 nF. A curve 95 represents the Vc, and a curve 96 represents the Vgs, for a capacitance of 15 nF.

Graph 100 includes a curve 101 representing the Vds and a curve 102 representing drain-source current (i.e., current Ids) for a capacitance of 5 nF. A curve 103 represents the Vds, and a curve 104 represents the Ids, for a capacitance of 10 nF. A curve 105 represents the Vds, and a curve 106 represents the Ids, for a capacitance of 15 nF.

In the examples of FIGS. 3A-3C, the turn off energy is 35.2 milli-Joules (mJ) for 5 nF, 37.9 mJ for 10 nF, and 38.3 mJ for 15 nF. Turn on energy is 36.9 mJ for 5 nF, 40.2 mJ for 19 nF, and 41.5 mJ 15 nF.

As shown, increasing the capacitance slightly affects the Vgs. Increasing the capacitance increases both turn off and turn on energy (which can decrease efficiency) and reduces switching speed (current fall time), but also reduces voltage overshoot (FIG. 3B). The overshoot is shown in close-up by FIG. 3C, which shows peak voltage reducing with higher capacitance. The variable capacitance can be precisely tuned under various conditions (e.g., vehicle speed and motor speed) to balance the desire for high switching speeds and the desire for high efficiency and low overshoot.

Referring again to FIG. 2, in an embodiment, the variable resistor 80 is a gate magnetoresistor (GMR). A magnetoresistor is a device or component that has a resistance that is dependent on the strength of an external magnetic field. The GMR 80 is positioned proximate to a source of a magnetic field, such that the GMR 80 is located within the magnetic field when generated. The controller 76 varies or controls the resistance of the GMR 80 by modulating the magnetic field.

The GMR 80 can be controlled by using a variety of magnetic field sources. For example, as shown in FIG. 2, the GMR 80 is positioned proximate to an inductive coil 84, which is controlled by control signals Rg to vary the magnetic field generated by the coil 84. The coil 84 is electrically isolated from the inverter circuit, and may be controlled via the gate driver 78 or directly connected to the controller 76 (bypassing the gate driver 78).

The GMR 80 may be controlled by modulating other magnetic fields. For example, the GMR 80 is positioned proximate to AC or DC current sources or other circuit components, such that the GMR 80 is exposed to magnetic fields generated by AC current or DC current. The AC current may be modulated to change the magnetic field and thereby control the gate resistance (e.g., gate-source resistance or Rgs). Gate resistance can be controlled using the GMR 80 (or other variable resistor) for multiple purposes. As discussed herein, the gate resistance is controlled to control slew rate to increase efficiency. The gate resistance may also be controlled, for example, to increase resistance for the purpose of heating the inverter and/or coolant in low temperature conditions.

The switching control system 40, in an embodiment, is configured such that the controller 76 is electrically isolated from the inverter 38. For example, the gate driver 78 functions to electrically isolate the GMR 80, the variable capacitor 82 and the coil 84 from the controller 76.

Figure 4:
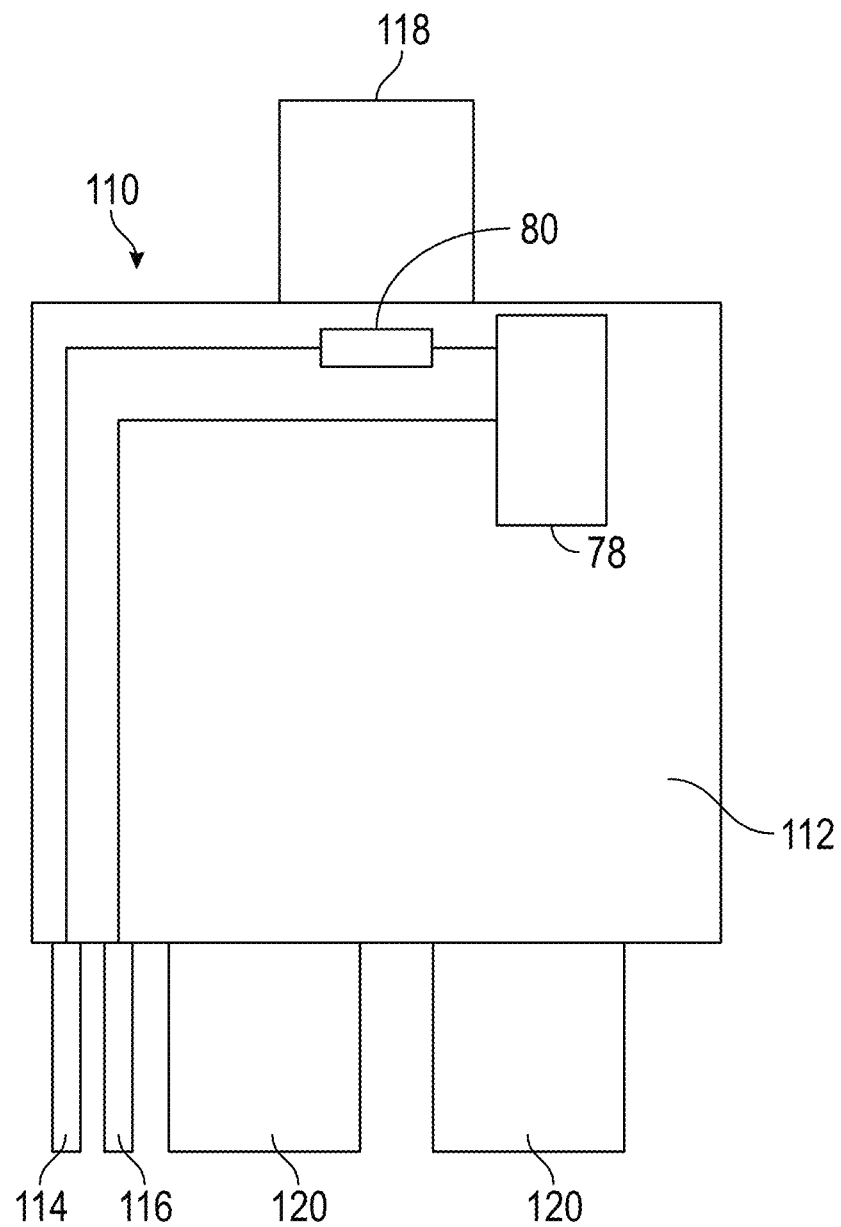
FIG. 4 depicts a switching control system including a variable gate resistor, in accordance with an exemplary embodiment.

FIG. 4 depicts an embodiment of a power module 110 that can be used to control slew rates using the GMR 80. The module 110 includes a circuit board 112 on which is mounted the GMR 80 and the gate driver 78. The gate driver 78 provides a modulated control signal (PWM signal) to the switch 60 via leads 114 and 116. The GMR 80 may be positioned proximate to a source 118 of AC current (e.g., the inverter circuit and/or an AC busbar). The AC current generates a magnetic field that can be modulated or controlled (e.g., by the controller 76) to control the gate resistance. Alternatively, or additionally, a source 120 of DC current (e.g., DC busbars) can be positioned proximate to the GMR 80 and the corresponding magnetic field is controlled to control the gate resistance.

Figure 5A:
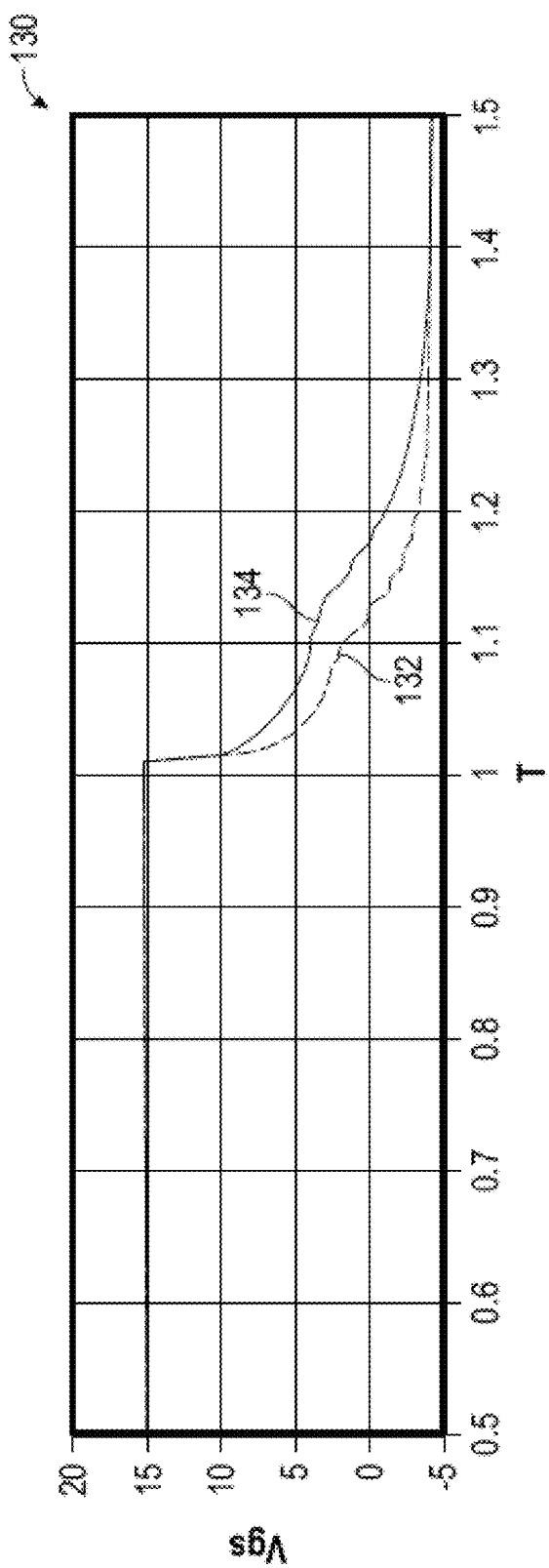
FIGS. 5A and 5B depict examples of voltage and current parameters of a switching device having a switching speed controlled using variable gate resistance.
Figure 5B:
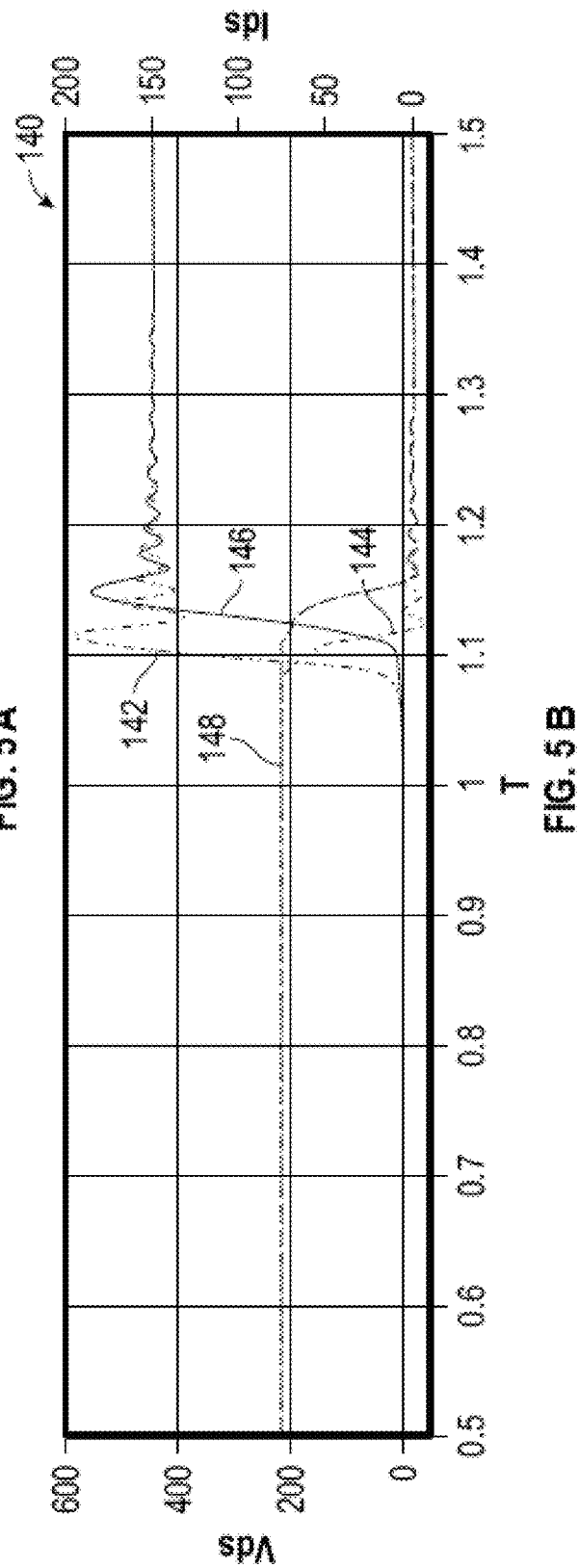

FIGS. 5A and 5B show examples of the effect of controlling gate resistance using the GMR 80 or other variable resistor. FIG. 5A includes a graph 130 that shows gate-source voltage Vgs (in volts or V) as a function of time (in microseconds or µs) during a switching event. FIG. 5B shows a graph 140 of drain-source voltage Vds voltage (in V) and current Ids (in amps or A) of the switch 60 during the switching event.

In FIG. 5A, the graph 130 includes a curve 132 representing the Vgs for a gate resistance of 2 ohms, and a curve 134 representing the Vgs, for a gate resistance of 5 ohms. In FIG. 5B, the graph 140 includes a curve 142 representing the Vds, and a curve 144 representing the Ids, for 2-ohm gate resistance. A curve 146 represents the Vds, and curve 148 represents the Ids, for 5-ohm gate resistance.

As shown in FIG. 5B, increasing the gate resistance from 2 ohms to 5 ohms reduces the switching speed, but also reduces voltage overshoot. The voltage overshoot reduction is realized as a decrease in the peak voltage. Likewise, reducing the gate resistance increases switching speed but also increases voltage overshoot. This example illustrates the capability of the switch control system 40 to precisely balance switching speed and overshoot.

Figure 6:
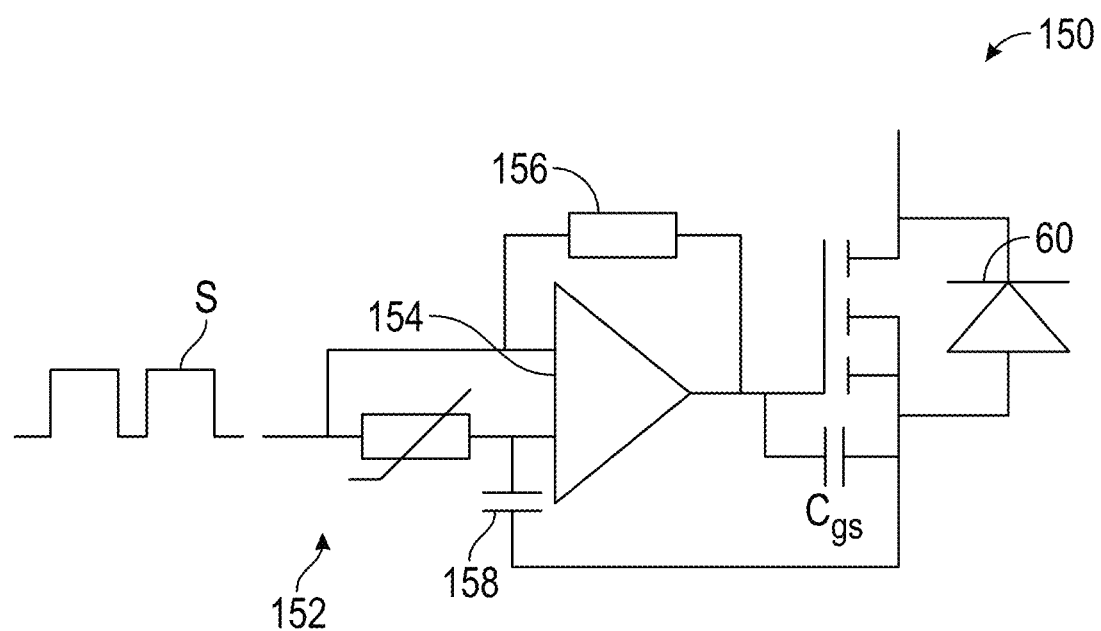
FIG. 6 depicts a switch control device including a circuit configured to control a switching speed of a switch by modulating a resistor and varying switch capacitance, in accordance with an exemplary embodiment.

FIG. 6 shows an embodiment of an auxiliary circuit 150 that may be included in the switch control system 40, in place of the GMR 80 (or power module 110). Alternatively, the circuit 150 may be included as an additional circuit to support the GMR 80 and/or variable capacitor 82.

The circuit 150 is an amplifier circuit that acts as a capacitance multiplier. The circuit 150 includes a magnetoresistor 152 connected in series to a power amplifier 154. A feedback resistor 156 is connected in parallel to the amplifier 154, and a capacitor 158 connected to the source of the switch 60. The circuit is controllable by applying a PWM signal (S) and controlling a gate-source capacitance (Cgs), and thereby controlling switching speed.

Figure 7:
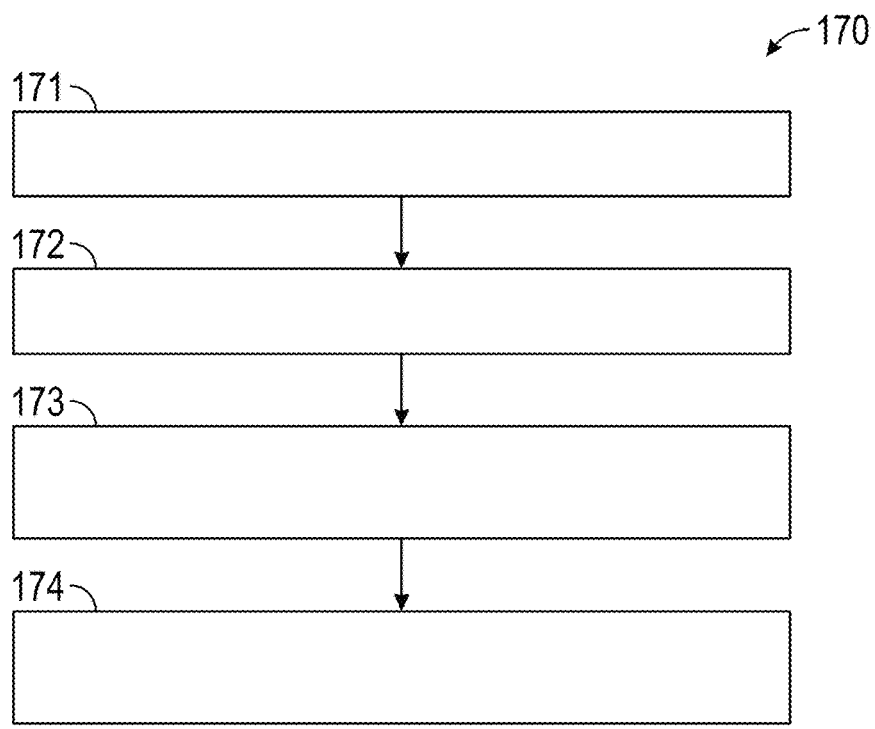
FIG. 7 is a flow diagram depicting aspects of a method of operating a vehicle and controlling switching in a vehicle inverter, in accordance with an exemplary embodiment.

FIG. 7 illustrates embodiments of a method 170 of controlling switching speed of semiconductor switches in an electronic device. The method 170 is discussed in conjunction with controlling a vehicle and controlling switching speeds of an inverter, but is not so limited and can be applied to any suitable device or system having semiconductor switches.

Aspects of the method 170 may be performed by a processor or processors, such as the controller 76, a vehicle control unit and/or the computer system 42. It is noted the method 100 is not so limited and may be performed by any suitable processing device or system, or combination of processing devices.

The method 170 includes a number of steps or stages represented by blocks 171-174. The method 170 is not limited to the number or order of steps therein, as some steps represented by blocks 171-174 may be performed in a different order than that described below, or fewer than all of the steps may be performed.

At block 171, the processing device monitors inverter operation and vehicle operating conditions. Examples of vehicle operating conditions include motor torque, motor speed, vehicle speed, temperature and others.

At block 172, the processing device determines an optimal switching speed for a given vehicle operating condition, which is the highest speed achievable while maintaining voltage peaks at or below a voltage threshold (to reduce or eliminate overshoot).

At block 173, the processing device alters the switching speed of each switch in a vehicle inverter (e.g., the inverter 38) during one or more switching events. For example, the processing device provides a control signal to a gate driver (e.g., the gate driver 78) of each switch (e.g., the switch 60) to raise or lower the capacitance of each switch. In another example, the processing device controls a gate magnetoresistor such as the GMR 80 (or other variable resistor) connected to the gate of each switch, by sending a control signal to the gate drivers to control a magnetic field proximate to the variable resistor. For example, the processing device applies a PWM voltage to an inductive coil through a gate driver, or sends a current signal directly to the coil (bypassing the gate drivers).

The switching speed is controlled based on any desired conditions. For example, switching speed may be increased to a higher rate in low speed conditions such as city driving, or decreased to a lower rate for high speed conditions such as highway driving. In another example the switching speed is controlled to increase or decrease efficiency based on efficiency and temperature requirements.

Figure 8:
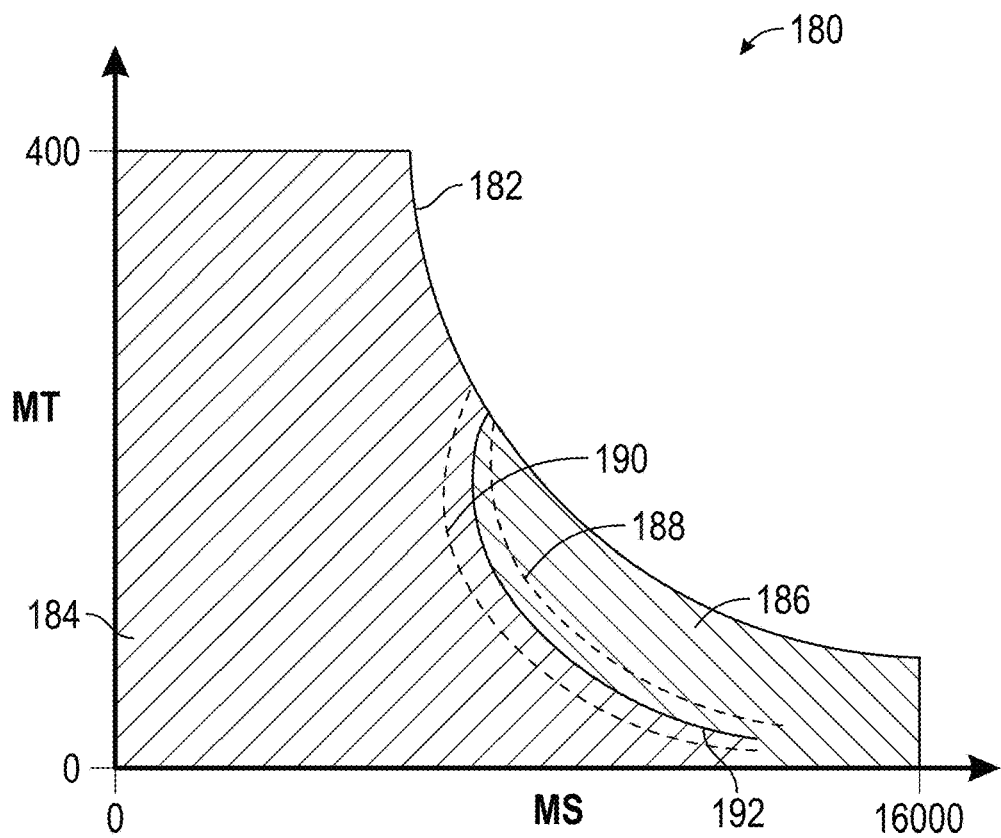
FIG. 8 depicts aspects of controlling switching speed based on vehicle operating conditions, in accordance with an exemplary embodiment.

FIG. 8 shows an example of conditions used to prescribe switching speed controls. In this example, the switching speed is controlled to achieve optimum efficiency based on DC bus voltage, motor torque, motor speed and/or vehicle speed, for a vehicle have a dual voltage (e.g., 400V and 800V) drive system. FIG. 8 shows drive efficiency in a torque-speed graph and efficiency map 180. The map 180 includes a torque-speed curve 182 representing motor torque (MT) in Newton-meters (NM) as a function of motor speed (MS), an efficiency map region 184 for 400V operation, and an efficiency map 186 for 800V. Switch gates can be tuned to limit current ripple to between hysteretic bands 188 and 190 for optimal efficiency (e.g., to stay along an optimal efficiency boundary 192).

Referring again to FIG. 7, at block 174, the processing device can communicate with remote entities, such as a control center, data center and/or other vehicles to send and receive switching control information. For example, gate voltage and/or gate-source capacitance parameters can be wirelessly or otherwise transmitted via a transmitter for purposes such as, updating gate resistance and/or gate capacitance control schemes, fleet data collection and prognosis.

Figure 9:
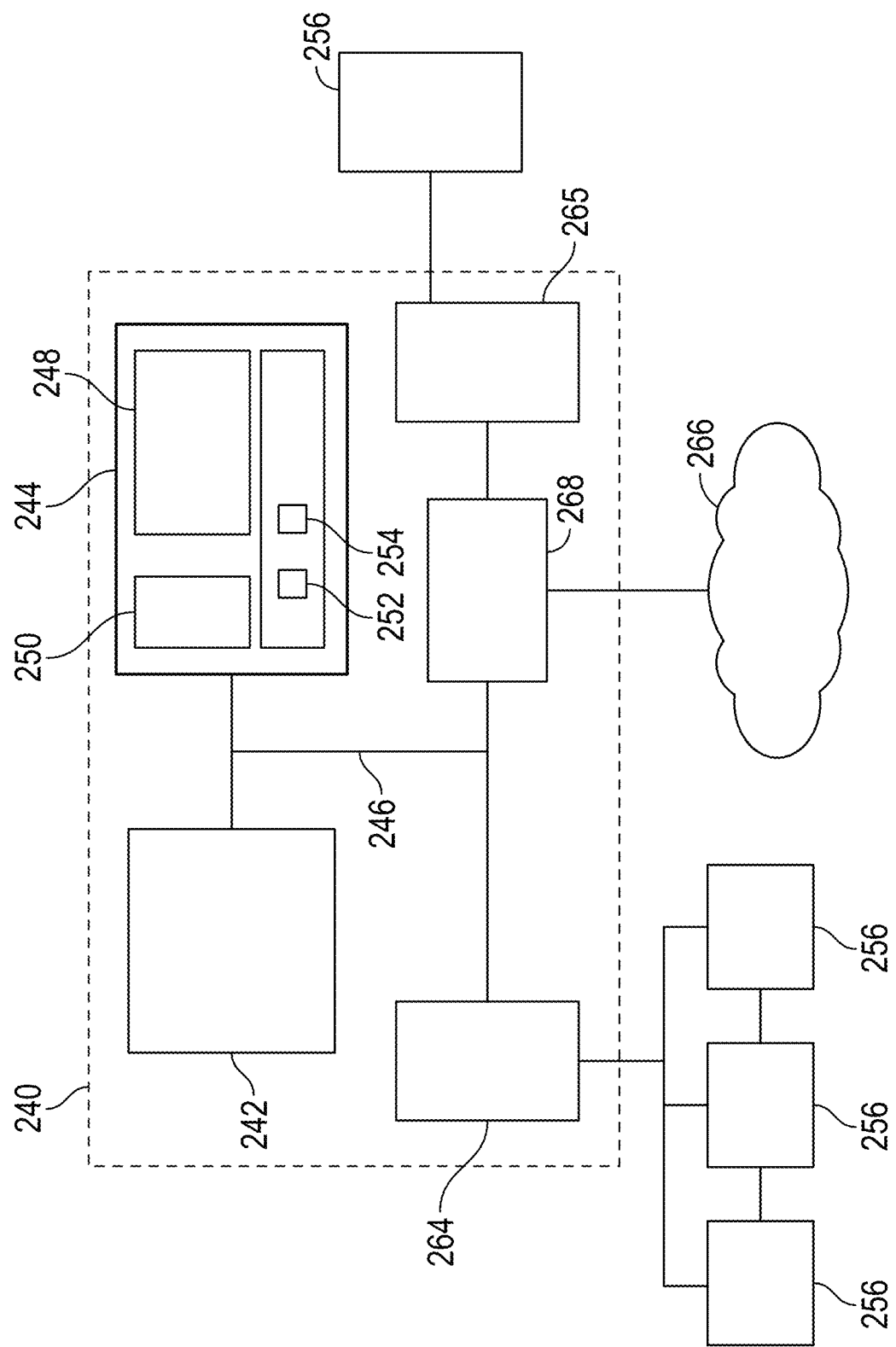
FIG. 9 depicts a computer system in accordance with an exemplary embodiment.

FIG. 9 illustrates aspects of an embodiment of a computer system 240 that can perform various aspects of embodiments described herein. The computer system 240 includes at least one processing device 242, which generally includes one or more processors for performing aspects of image acquisition and analysis methods described herein.

Components of the computer system 240 include the processing device 242 (such as one or more processors or processing units), a memory 244, and a bus 246 that couples various system components including the system memory 244 to the processing device 242. The system memory 244 can be a non-transitory computer-readable medium, and may include a variety of computer system readable media. Such media can be any available media that is accessible by the processing device 242, and includes both volatile and non-volatile media, and removable and non-removable media.

For example, the system memory 244 includes a non-volatile memory 248 such as a hard drive, and may also include a volatile memory 250, such as random access memory (RAM) and/or cache memory. The computer system 240 can further include other removable/non-removable, volatile/non-volatile computer system storage media.

The system memory 244 can include at least one program product having a set (e.g., at least one) of program modules that are configured to carry out functions of the embodiments described herein. For example, the system memory 244 stores various program modules that generally carry out the functions and/or methodologies of embodiments described herein. A module or modules 252 may be included to perform functions related to controlling operation of inverters and other conversion devices as discussed herein. A module or modules 254 may be included to perform functions related to controlling slew rates or switching speeds as discussed herein. The system 240 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 242 can also communicate with one or more external devices 256 as a keyboard, a pointing device, and/or any devices (e.g., network card, modem, etc.) that enable the processing device 242 to communicate with one or more other computing devices. Communication with various devices can occur via Input/Output (I/O) interfaces 264 and 265.

The processing device 242 may also communicate with one or more networks 266 such as a local area network (LAN), a general wide area network (WAN), a bus network and/or a public network (e.g., the Internet) via a network adapter 268. It should be understood that although not shown, other hardware and/or software components may be used in conjunction with the computer system 240. Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this invention belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system comprising:
   an electronic device including a circuit having a semiconductor switch; and
   a switching control system operably connected to the semiconductor switch, the switching control system including a controller configured to control a switching speed of the semiconductor switch based on a received voltage by altering at least one of a gate resistance and a gate capacitance of the semiconductor switch, the switching control system including at least one of:
   a variable resistor connected to a gate of the semiconductor switch and a gate driver, the controller configured to control the variable resistor to alter the gate resistance; and
   a variable capacitor connected to the gate of the semiconductor switch and the gate driver, the controller configured to control the variable capacitor to alter the gate resistance.

2. The system of claim 1, wherein the variable resistor includes a magnetoresistive gate resistor positioned to be exposed to a magnetic field generated by an inductive coil.

3. The system of claim 1, wherein the variable resistor is a magnetoresistive gate resistor, the controller configured to control the magnetoresistive gate resistor by controlling a current through at least one of the circuit and the switching control system to change a magnetic field around the magnetoresistive gate resistor.

4. The system of claim 3, wherein the current is alternating current, and the magnetoresistive gate resistor is disposed proximate to a conductor that conducts the alternating current.

5. The system of claim 1, wherein the switching control system includes a capacitance multiplier circuit including a power amplifier.

6. The system of claim 5, wherein the switching control system is configured to control the variable capacitor by applying a modulated signal to control an internal capacitance of the capacitance multiplier circuit.

7. The system of claim 1, wherein the electronic device is an inverter configured to control AC power to an electric motor of a vehicle.

8. The system of claim 7, wherein the switching speed is controlled based on at least one of a motor torque and a DC bus voltage.

9. A method comprising:
receiving electrical power by an electronic device including a circuit having a semiconductor switch; and
controlling a switching speed of the semiconductor switch based on a received voltage by a switching control system operably connected to the semiconductor switch, wherein controlling the switching speed includes altering at least one of a gate resistance and a gate capacitance of the semiconductor switch, the switching control system including at least one of:
a variable resistor connected to a gate of the semiconductor switch and a gate driver, wherein altering the gate resistance includes controlling the variable resistor; and
a variable capacitor connected to the gate of the semiconductor switch and a gate driver, wherein altering the gate resistance includes controlling the variable capacitor.

10. The method of claim 9, wherein the switching speed is controlled during a switching event.

11. The method of claim 9, wherein the variable resistor includes a magnetoresistive gate resistor positioned to be exposed to a magnetic field generated by an inductive coil.

12. The method of claim 9, wherein the variable resistor is a magnetoresistive gate resistor, and altering the gate resistance includes controlling current through at least one of the circuit and the switching control system to change a magnetic field around the magnetoresistive gate resistor.

13. The method of claim 9, wherein the switching control system includes a capacitance multiplier circuit including a power amplifier.

14. The method of claim 13, wherein altering the gate resistance includes applying a modulated signal to control an internal capacitance of the capacitance multiplier circuit.

15. A system of a vehicle, comprising:
an inverter configured to control alternating current (AC) power to an electric motor of the vehicle, the inverter including a circuit having a semiconductor switch; and
a switching control system operably connected to the semiconductor switch, the switching control system including a controller configured to control a switching speed of the semiconductor switch based on a received voltage by altering at least one of a gate resistance and a gate capacitance of the semiconductor switch, the switching control system including at least one of:
a variable resistor connected to a gate of the semiconductor switch and a gate driver, the controller configured to control the variable resistor to alter the gate resistance; and
a variable capacitor connected to the gate of the semiconductor switch and the gate driver, the controller configured to control the variable capacitor to alter the gate resistance.

16. The system of claim 15, wherein the variable resistor includes a magnetoresistive gate resistor positioned to be exposed to a magnetic field generated by an inductive coil.

17. The system of claim 15, wherein the variable resistor is a magnetoresistive gate resistor, and the controller is configured to control the magnetoresistive gate resistor by controlling current through the circuit to change a magnetic field around the magnetoresistive gate resistor.

18. The system of claim 15, wherein the switching control system includes a capacitance multiplier circuit including a power amplifier.

19. The system of claim 15, wherein the switching speed in controlled based on a motor torque and vehicle speed to maximize the switching speed and minimize voltage overshoot.

20. The system of claim 15, further comprising a transmitter configured to wirelessly transmit information including at least one of gate resistance and gate capacitance to a remote entity.

* * * * *